United States Patent
Ohkubo et al.

(10) Patent No.: US 6,847,667 B2
(45) Date of Patent: Jan. 25, 2005

(54) SEMICONDUCTOR LASER DEVICE AND LASER MODULE USING SAME

(75) Inventors: Atsushi Ohkubo, Sodegaura (JP);
Satoru Okada, Sodegaura (JP);
Tsuyoshi Fujimoto, Sodegaura (JP);
Takeshi Koiso, Sodegaura (JP);
Kiyofumi Muro, Ichihara (JP); Michio Ohkubo, Chiyoda-ku (JP); Yutaka Ohki, Chiyoda-ku (JP)

(73) Assignees: Mitsui Chemicals Inc., Tokyo (JP);
The Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 10/802,753

(22) Filed: Mar. 18, 2004

(65) Prior Publication Data

US 2004/0179565 A1 Sep. 16, 2004

Related U.S. Application Data

(63) Continuation of application No. PCT/JP02/09818, filed on Sep. 25, 2002.

(30) Foreign Application Priority Data

Sep. 28, 2001 (JP) ........................................ 2001-303438

(51) Int. Cl.$^7$ .............................................. H01S 5/00
(52) U.S. Cl. .............................. 372/43; 372/44; 372/45; 372/46; 372/47; 372/48; 372/49; 372/50; 372/92; 372/96; 372/102
(58) Field of Search ............................ 372/43–50, 96, 372/92, 102

(56) References Cited

U.S. PATENT DOCUMENTS

| | | | | |
|---|---|---|---|---|
| 6,411,642 B1 | * | 6/2002 | Mazed ........................ | 372/103 |
| 6,614,822 B2 | * | 9/2003 | Yoshida et al. ................ | 372/45 |
| 6,614,823 B2 | * | 9/2003 | Funabashi et al. ............ | 372/45 |
| 6,765,935 B2 | * | 7/2004 | Kimura et al. ........... | 372/29.02 |
| 6,782,028 B2 | * | 8/2004 | Tsukiji et al. ................. | 372/50 |

FOREIGN PATENT DOCUMENTS

| | | |
|---|---|---|
| JP | 08-274403 | 10/1996 |
| JP | 2001-111493 | 4/2001 |
| WO | WO 96/00997 | 1/1996 |

* cited by examiner

Primary Examiner—Minsun Oh Harvey
Assistant Examiner—Delma R. Flores-Ruiz
(74) Attorney, Agent, or Firm—Oblon, Spivak, McClelland, Maier & Neustadt, PC

(57) ABSTRACT

A semiconductor laser device emitting a laser beam having stable emitting wavelength and a multimode spectrum is provided. The semiconductor laser device is a Fabry-Perot type semiconductor laser device having a layer structure including an active layer of a quantum well structure, and emitting a laser beam having wavelength stabilized by an action of return light and having a multimode spectrum, wherein each well layer satisfies relation:

$$\Gamma/d \leq 1.3 \times 10^{-3} \text{ nm}^{-1}$$

where $\Gamma$ and d(nm) are an optical confinement factor and a thickness of a well layer, respectively.

22 Claims, 7 Drawing Sheets

SEMICONDUCTOR LASER DEVICE AND LASER MODULE USING SAME

CROSS REFERENCE TO RELATED APPLICATION

This is a Continuation Application of PCT Application No. PCT/J02/09818, filed on Sep. 25, 2002, which was not published under PCT Article 21(2) in English. This application is based upon and claims the benefit of priority from the prior Japanese Patent Application No. 2001-303438, filed Sep. 28, 2001, the entire contents of which are incorporated herein by reference.

TECHNICAL FIELD

The invention relates to a Fabry-Perot type semiconductor laser device and a laser module fabricated using same, more specifically, a semiconductor laser device which operates receiving return light and thereby emits a laser beam having a multimode spectrum.

BACKGROUND ART

Wavelength Division Multiplexing (WDM) communication system has been developing as an optical communication system for transmitting a plurality of optical signals. In this system, for example, an Er-doped fiber amplifier (EDFA) is arranged at a predetermined place on an optical path, and a pumping laser module having a semiconductor laser device as a pumping light source is connected to the EDFA. Optical signals transmitted from a signal light source are optically amplified by a pumping laser beam emitted from the pumping laser module and introduced to the EDFA, and the optically-amplified optical signals are transmitted downstream.

Here, in order to stabilize the optical power of the pumping laser beam emitted from the laser module, the value of a current injected into the semiconductor laser device incorporated in the laser module is varied according to variation in the optical power of the signal light source.

In the case of a semiconductor laser device whose emitting wavelength is in the 1480 nm region, the gain band of the EDFA is broad, so that the above-mentioned treatment for stabilization is effective. However, in the case of a semiconductor laser device whose emitting wavelength is in the 980 nm region, the gain band of the EDFA is narrow, so that the above-mentioned treatment for stabilization cannot be taken.

Thus, when a laser module is fabricated using a semiconductor laser device whose lasing wavelength is in the 980 nm region, it is necessary to arrange that the wavelength of the pumping laser beam emitted from the fabricated laser module is specific wavelength suitable for the narrow gain band of the EDFA.

It is known that for stabilizing the emitting wavelength of a laser device, it is effective to operate the laser device with its emission end face (front facet) optically coupled to a Fiber Bragg Grating (FBG) having a predetermined reflection bandwidth. The reason is that the FBG has wavelength selection function and optical feedback function.

In this case, of the laser beam emitted from the laser device, a part within a predetermined wavelength band is reflected by the FBG and becomes return light. The return light is fed back to the laser device. By the action of the return light, the wavelength of the laser beam emitted from the laser device, hence, the wavelength of the pumping laser beam emitted from the laser module is stabilized at specific value within the reflection bandwidth of the FBG.

However, in the case of a GaAs laser device which is a representative semiconductor laser device whose emitting wavelength is in the 980 nm region, if a laser module is fabricated having the laser device optically coupled to an FBG, the optical power of an obtained pumping laser beam is unstable. Specifically, although the wavelength of the obtained pumping laser beam is within the reflection bandwidth of the FBG, the optical power of the pumping laser beam varies time-wise to a large degree. For example, only with variation of the operating state which is caused by variation of an injection current to the laser device, variation of ambient temperature or the like, the optical power of the pumping laser beam emitted from the laser module becomes unstable.

The reason is considered to be that in the case of the GaAs laser device, longitudinal modes easily become unstable, and that the optical power easily varies by several %.

Considering that it is required as a standard that variation of the optical power of a pumping laser beam emitted from a laser module should be normally 0.5% or less, above-mentioned phenomena are improper problems.

DISCLOSURE OF THE INVENTION

An object of the invention is to solve the above problems with the GaAs laser device and provide a GaAs semiconductor laser device so designed that when it is incorporated in a laser module as a light source, the laser module can emit a pumping laser beam whose optical power is stable, and a laser module using same.

In order to achieve the above object and fabricate a laser module which emits a pumping laser beam whose wavelength and optical power are stabilized, it is considered to be necessary that a laser beam emitted from a laser device incorporated in the laser module as a light source should have laser emission wavelength stabilized at a specific wavelength and a multiplexed longitudinal mode in its spectrum. Thus, the invention provides a Fabry-Perot type semiconductor laser device having a layer structure including an active layer of a quantum well structure, and emitting a laser beam having wavelength stabilized by an action of return light and having a multimode spectrum, wherein each well layer satisfies relation:

$$\Gamma/d \leq 1.3 \times 10^{-3} \text{ nm}^{-1}$$

where $\Gamma$ and $d$(nm) are an optical confinement factor and a thickness of a well layer, respectively.

Specifically, the return light is return light from an optical feedback mechanism of which a good example is an FBG. Preferably, the thickness (d) of a well layer is 8.5 nm or larger. The invention also provides a semiconductor laser device wherein it is preferable that difference between energy level of a conduction band of barrier layer and energy level of a conduction band of well layer in the active layer is 170 meV or smaller.

The invention further provides a semiconductor laser device wherein in order to restrain hole burning during high-power operation, a major part of injected carriers are optimized within a profile region of an emitted laser beam, and the optimization is done by selecting a stripe width of a current blocking layer.

Further, the invention provides a semiconductor laser device wherein it is preferable that optical confinement layers are formed in the state of interposing the active layer and carrier blocking layers are each provided between the active layer and one of the optical confinement layers, the carrier blocking layers having bandgap energy larger than bandgap energy of barrier layer in the active layer and the optical confinement layer; and a semiconductor laser device wherein separated confinement layers are formed in the state of interposing the active layer, the separated confinement layers having bandgap energy equal to or larger than bandgap energy of barrier layer in the active layer.

The invention further provides a laser module wherein an optical fiber is optically coupled to an emission end face of an laser device as described above.

BEST MODE OF CARRYING OUT THE INVENTION

The laser device according to the present invention has been developed on the basis of the following design thought:
(1) What is required of a laser device which is incorporated as a light source in a laser module which should emit a pumping laser beam of stable optical power is that the emission wavelength of a laser beam emitted from the laser device should be stabilized and that variation of the optical power of the laser beam should be restrained.
(2) Stabilization of emission wavelength can be achieved, for example, by combining a laser device with an FBG and feeding return light back to the laser device. Restraint of variation of the optical power of an emitted laser beam can be achieved by designing a laser device so that a laser beam emitted from the laser device may have a multimode spectrum.
(3) In the case of a laser device to which return light is fed back, it is known that a laser beam emitted from the laser device has a multimode spectrum when coherence collapse occurs.
(4) Hence, in order to arrange that an emitted laser beam has a multimode spectrum to thereby stabilize the optical power of the emitted laser beam, it is thought important to find out, in the active layer structure of a laser device, a factor which contributes to coherence collapse occurring easily.

Conventionally, the active layer structure is made mainly on the basis of the design thought that a generated laser beam should be confined in the active layer efficiently. In contrast, in order to arrange that a generated laser beam has a multimode spectrum, it is considered important to design an active layer structure in which emission does not easily occur.
(5) On the basis of the above thought, the inventors studied, concerning various laser devices, relation between the thickness (d) and optical confinement factor ($\Gamma$) of a well layer and an emitted laser beam having a multimode spectrum. From their study, they obtained new knowledge that when return beam is fed back, the value $\Gamma/d$ is a factor which affects coherence collapse, irrespective of semiconductor materials of which the active layer is made.
(6) From further study, the inventors also found out that the larger the thickness of a well layer, the more easily coherence collapse occurs, and that the smaller the potential depth of a well layer, the more easily coherence collapse occurs.

On the basis of the above knowledge and the known fact that a longer cavity length is advantageous to high-power operation of a laser device, the inventors developed the semiconductor laser device according to the invention having the above-described structure.

Next, the laser device according to the invention developed on the basis of the above design thought will be described in detail.

Figure 1:
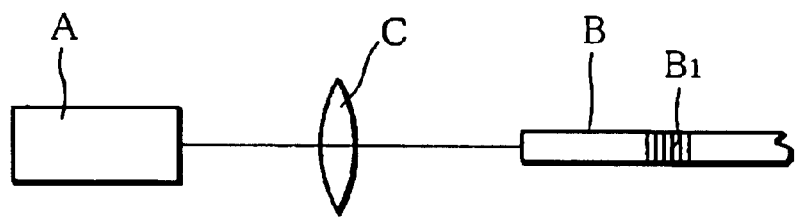
FIG. 1 is a schematic diagram showing how a laser device according to the invention is used.

First, FIG. 1 schematically shows how a laser device according to the invention is used.

In FIG. 1, a laser device A (described later) and an optical fiber B are optically coupled together by, for example, a lens C which is an optical coupling means, with their optical axes aligned, to form a laser module. In the optical fiber B is formed, for example, an FBG $B_1$ having a predetermined reflection bandwidth.

A laser beam emitted from the laser device A is focused by the lens C and enters an end face of the optical fiber B. Of the laser beam which has entered, light of emitting wavelength which is within the reflection bandwidth of the FBG $B_1$ is reflected by the FBG $B_1$ and fed back to the laser device A as return light.

In the present invention, since the laser device A has a structure described below, the laser beam emitted from the laser device A has stabilized emitting wavelength and a multimode spectrum.

Figure 2:
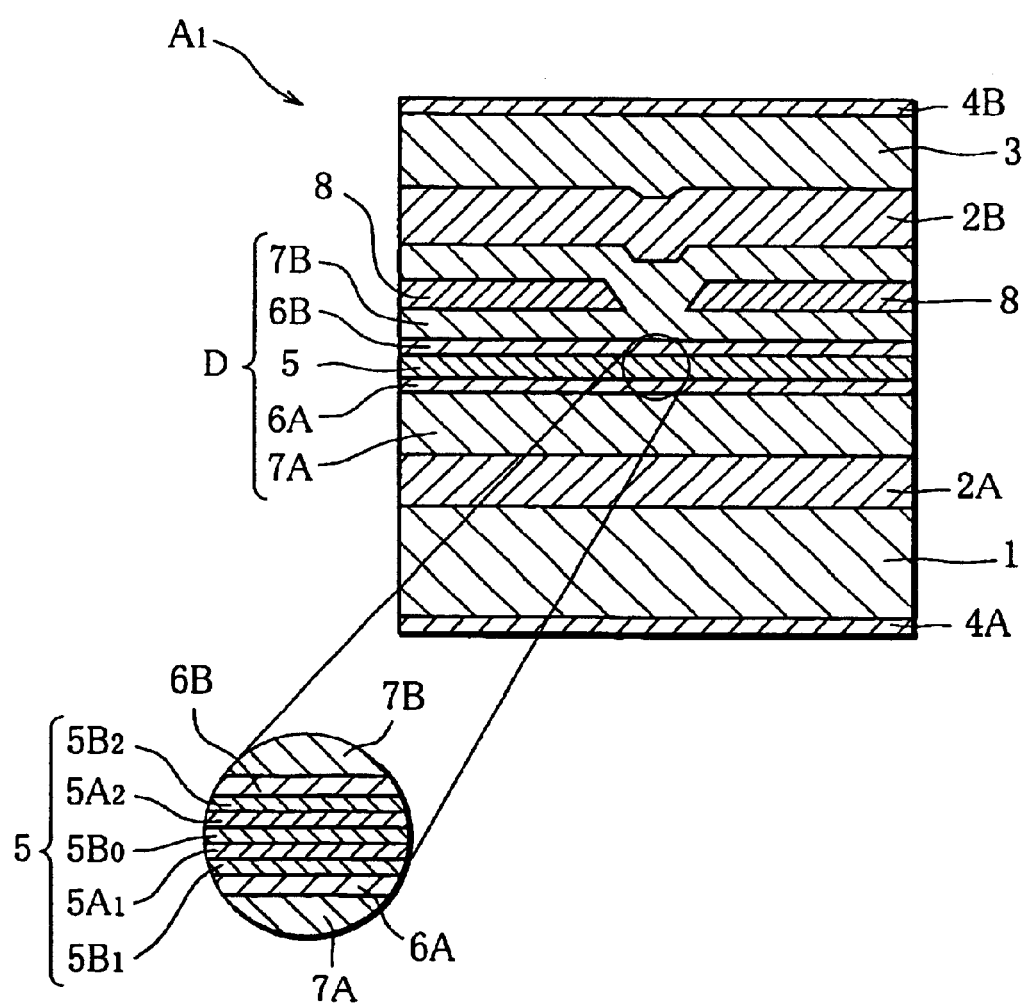
FIG. 2 is a cross-sectional view showing the layer structure of an example $A_1$ of a laser device according to the invention.

FIG. 2 shows an example $A_1$ of a laser device according to the invention having a desirable layer structure. The laser device $A_1$ has a self-aligned structure (SAS), and it is, as a whole, a Fabry-Perot type laser device having a predetermined cavity length (L).

As shown in FIG. 2, the laser device $A_1$ is formed as follows: On a substrate 1 of, for example, n-GaAs is formed a lower cladding layer 2A of, for example, n-AlGaAs. On the lower cladding layer 2A is formed a layer structure D (described later). On the layer structure D, an upper cladding layer 2B of, for example, p-AlGaAs and a contact layer 3 of, for example, p-GaAs are formed in this order. On the rear side of the substrate 1 is formed an n-type electrode 4A, and on the contact layer 3 is formed a p-type electrode 4B.

The above-mentioned layer structure D is a layer structure which is proposed as Decoupled Confinement Heterostructure (DCH) in Functional Material, vol. 17, No. 8, pp. 26–33 (1997, August number).

Specifically, the layer structure D includes an active layer 5 of a quantum well structure consisting of two well layers $5A_1$, $5A_2$ of, for example, InGaAs and three barrier layers $5B_0$, $5B_1$, $5B_2$ of, for example, AlGaAs, where each well layer lies between two barrier layers.

On the respective outer sides of the barrier layers $5B_1$, $5B_2$ which lie at both ends of the active layer 5 as viewed in the thickness direction of the active layer 5, carrier blocking layers having larger bandgap energy than the other layers (described later) are arranged, respectively. Further, on the respective outer sides of the carrier blocking layers, a lower optical confinement layer 7A of, for example, n-GaAs and an upper optical confinement layer 7B of, for example, p-GaAs are arranged, respectively. The barrier layers $5B_1$, $5B_2$ which lie at both ends of the active layer 5 will be hereinafter called side barrier layers.

More Specifically, between the side barrier layer $5B_1$ and the lower optical confinement layer 7A is provided a lower carrier blocking layer 6A of, for example, n-AlGaAs, and between the side barrier layer $5B_2$ and the upper optical confinement layer 7B is provided an upper carrier blocking layer 6B of, for example, p-AlGaAs.

In the upper optical confinement layer 7B (in FIG. 2, in the middle of the upper optical confinement layer 7B as viewed in the thickness direction), a current blocking layer 8 of, for example, n-AlGaAs having a certain stripe width (W) is formed so that carriers can be efficiently injected from the p-type electrode 4B into the active layer 5.

Figure 3:
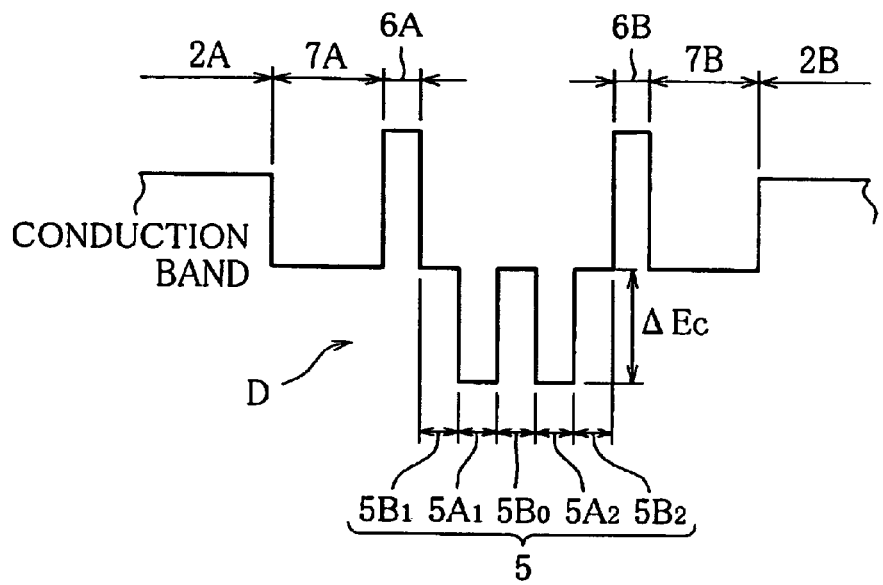
FIG. 3 shows an example of a band structure of a layer structure D in the laser device $A_1$.

FIG. 3 schematically shows an example of band structure of the above-described layer structure D.

In the layer structure D having the band structure shown in FIG. 3, due to the high bandgap of the carrier blocking layers 6A and 6B provided on both sides of the active layer 5, carriers injected into the active layer 5 are efficiently confined in the active layer 5 without spreading outside the active layer 5, and contribute to emission of a laser beam. The emitted laser beam is confined in the DCH as a whole, and propagates in it. Thus, in the DCH, the optical confinement layers 7A, 7B on the respective outer sides of the carrier blocking layers 6A, 6B also function as optical waveguide layers.

In the laser device $A_1$ according to the invention having the above-described layer structure, the DCH is designed as follows:

(1) Suppose that the thickness of each well layer $5A_1$, $5A_2$ is d(nm) and the optical confinement factor of each well layer $5A_1$, $5A_2$ is $\Gamma$. The DCH is so designed that d value and $\Gamma$ value may satisfy the relation:

$$\Gamma/d \leq 1.3 \times 10^{-3} \text{ nm}^{-1}. \quad (1)$$

When this relation is satisfied, an emitted laser beam has a multimode spectrum and optical power stabilized time-wise, with all values of a current injected into the laser device $A_1$, as described later.

(2) As long as the above relation (1) is satisfied, it is preferable that the thickness (d) of each well layer $5A_1$, $5A_2$ is 8.5 nm or larger.

When each well layer has such thickness, the formed quantum wells have a higher energy level in addition to the lowest energy level. Part of carriers injected from the p-type electrode 4B are caught at this higher level, so that the rate of net gain increase relative to the amount of injected current becomes smaller.

Conversely speaking, disturbance in the laser device due to minute variation of gain by return light becomes larger, so that coherence collapse occurs more easily.

The upper limit to the thickness of the well layer is restricted by the critical thickness of a semiconductor material of which the well layer is made. However, even when the thickness of the well layer is smaller than the critical thickness, if the thickness of the well layer is too large, lasing starts at a second quantum level, which causes deterioration of the emitted laser beam. Thus, it is desirable that the upper limit to the thickness of the well layer is about 12 nm.

When the thickness (d) of the well layer is determined, the optical confinement factor ($\Gamma$) of the well layer is determined to be an appropriate value which satisfies the relation (1), depending on the determined thickness. Then, on the basis thereof, the kind, composition, etc. of semiconductor material for use in forming the well layer are selected.

(3) Based on similar principle, in the active layer 5 in the layer structure D, it is desirable to arrange that the difference ($\Delta Ec$) between the energy level of the conduction band of the barrier layer $5B_0$ ($5B_1$, $5B_2$) and the energy level of the conduction band of the well layer $5A_1$ ($5A_2$) is 170 meV or smaller.

When $\Delta Ec$ is arranged this way, part of injected carriers overflow from the well layers into the barrier layers, so that the rate of net gain increase becomes smaller.

However, when $\Delta Ec$ value is too small, injected carriers are not efficiently recombined. Thus, it is desirable that the lower limit to $\Delta Ec$ value is about 95 meV.

For this, it is good to form the side barrier layers $5B_1$, $5B_2$ of $Al_xGa_{1-x}As$ ($0 \leq x < 0.1$). Forming the side barrier layers $5B_1$, $5B_2$ of GaAs is particularly desirable.

(4) Although the cavity length (L) of the laser device $A_1$ is not restricted to any particular length, it is desirable to make the cavity length (L) 1500 $\mu$m or larger, intending high power. However, it is practically difficult to fabricate a laser device having a cavity length (L) of over 3000 $\mu$m. Thus, it is desirable that the upper limit to the cavity length (L) is about 3000 $\mu$m.

(5) In the laser device according to the invention, the stripe width of the current blocking layer is optimized so that most of injected carriers may be included in the profile region of an emitted laser beam. Specifically, the stripe width is arranged to be 3.5 $\mu$m or smaller. The design thought underlying this is as follows:

As stated above, the design thought on which the laser device according to the invention is based is to design a laser device having an active layer structure in which emission does not easily occur so that the emitted laser beam may have a multimode spectrum.

Since the invention is based on this design thought, it is necessary to arrange that a fabricated laser device will hold high kink power.

For example, when a laser device is so designed that r value is small and d value is large (i.e., well layers are thick), which is the case with the laser device according to the invention, the threshold carrier density is high.

Thus, irrespective of details of the layer structure, variation of refractive index relative to variation of carrier density is large, and hence, in general, a phenomenon called hole burning occurs to a large degree. As a result, transverse modes become unstable from a low-power operation stage, and kink occurs easily.

Thus, in the laser device according to the invention, countermeasures need to be taken against hole burning. Specifically, the stripe width (W) of the current blocking layer 8 located above the active layer 5 is optimized to restrain hole burning.

The size of the profile region of an emitted laser beam is determined by the difference in effective refractive index between the stripes and the other regions, which mainly come from the width of stripes formed in a laser device and laser structure such as formation of a current blocking layer, for example.

Generally, in a laser device having a current blocking layer, the stripe width of the current blocking layer is arranged to be about 4 to 6 µm.

However, according to IEEE, Photonics Technology Letters, vol. 6, No. 12, pp. 1409–1411, 1994, in this kind of laser device, injected carriers spread in the transverse direction of the active layer, so that the region where carriers are distributed is broader than the profile region of an emitted laser beam. Due to this, the profile of the emitted laser beam becomes unstable when the laser device operates with high power. In other words, the high-power characteristics of the laser device deteriorate.

Hence, it is thought that in order to stabilize the profile of an emitted laser beam even in high-power operation, if a state such that the profile region of an emitted laser beam is broader than the region where injected carriers are distributed and the latter is included in the former is achieved, hole burning is restrained and high kink power is achieved.

It is thought that this can be achieved by making the stripe width of the current blocking layer narrow enough and thereby making the region where injected carriers are distributed narrow.

On the basis of this view, the inventors studied relation between the stripe width and the kink power as described later, and found out that in the laser device according to the invention, arranging the stripe width to be 3.5 µm or smaller is good for restraining hole burning even in high power operation of, for example, 200 mW or higher.

In that case, in order to keep the size of the profile region of an emitted laser beam almost constant, it is necessary to adjust the effective refractive-index difference between the stripes and the other regions appropriately, depending on the stripe width.

In fabricating the laser device $A_1$, semiconductor materials for individual layers are so selected that the above-mentioned design requirements may be satisfied.

As semiconductor materials usable in this case, for example, GaAs-based materials, AlGaAs-based materials, InGaAsP-based materials, InGaNAs-based materials, etc. can be mentioned. Regarding such materials, the kind, composition and layer thickness are selected appropriately to satisfy the above-mentioned design requirements.

Figure 5:
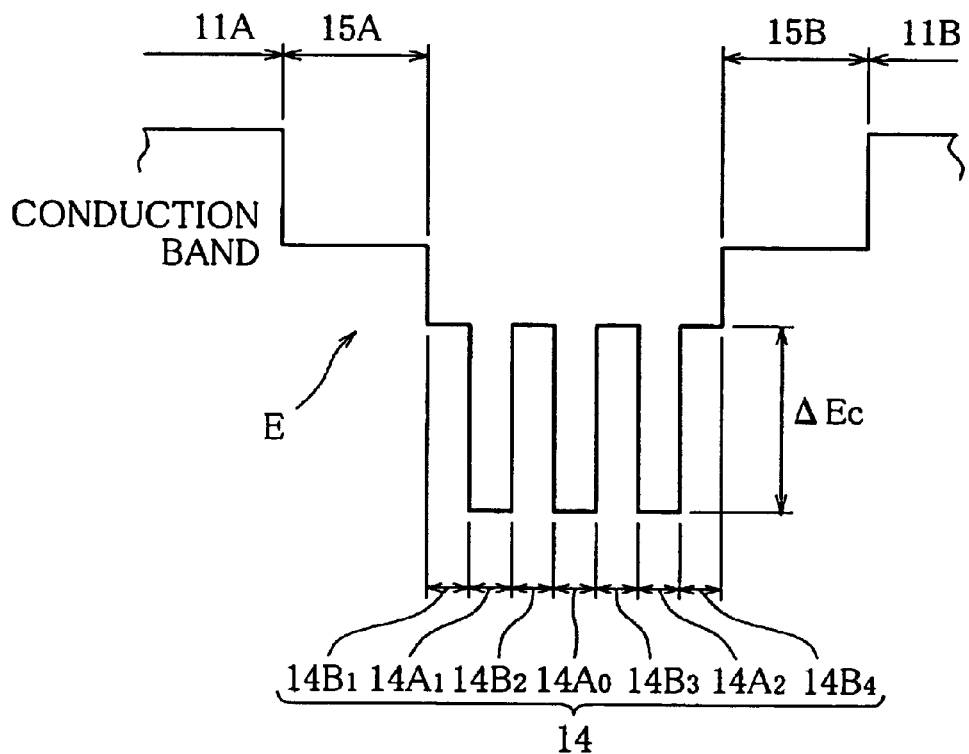
FIG. 5 shows an example of a band structure of a layer structure E in the laser device $A_2$.

While the layer structure D of the laser device $A_1$ is a DCH, the laser device according to the invention is not restricted to this. For example, a laser device $A_2$ having a layer structure shown in FIG. 5 is also suitable.

Figure 4:
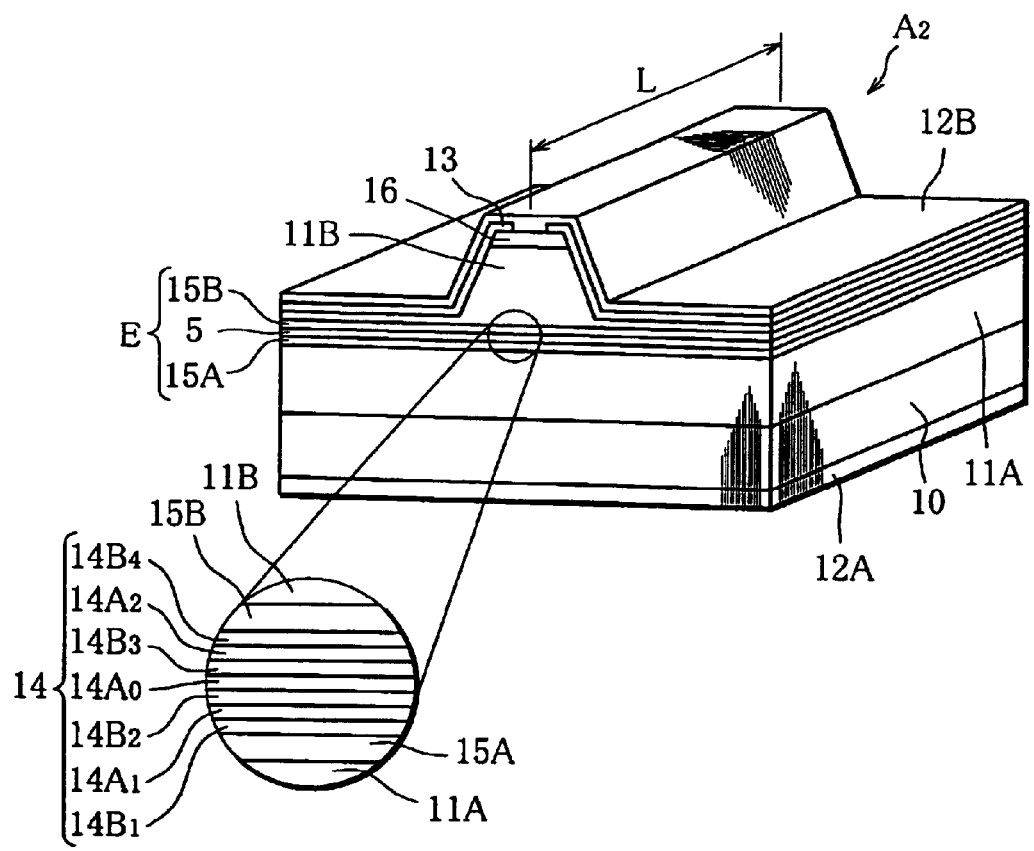
FIG. 4 is a perspective view showing the layer structure of another laser device $A_2$ according to the invention.

As shown in FIG. 4, the laser device $A_2$ has an upper part in the shape of a ridge waveguide, and the laser device $A_2$ as a whole has a predetermined cavity length (L). On a substrate 10 of, for example, n-GaAs, a lower cladding layer 11A of, for example, n-AlGaAs is formed, and on the lower cladding layer 11A, a layer structure E (described later) is formed. On the rear surface of the substrate 10 is formed an n-type electrode 12A. On the upper surface of the layer structure E is formed a protection film 13 of, for example, silicon nitride ($SiN_x$), and a p-type electrode 12B is formed in an opening in the protection film 13.

The layer structure E includes an active layer 14 of a quantum well structure consisting of three well layers $14A_0$, $14A_1$, $14A_2$ of, for example, InGaAs, and four barrier layers $14B_1$, $14B_2$, $14B_3$, $14B_4$ of, for example, GaAsP, where each well layer lies between two barrier layers.

On the respective outer sides of the barrier layers $14B_1$, $14B_4$ which lie at both ends of the active layer 14, a lower optical confinement layer 15A of, for example, AlGaAs and an upper optical confinement layer 15B of, for example, AlGaAs are arranged, respectively.

The layer structure E is called SCH (Separated Confinement Heterostructure). An example of a conduction band structure thereof is shown in FIG. 5.

According to the invention, also in the laser device $A_2$ having this SCH, the SCH is designed to satisfy the above-mentioned design requirements.

In the laser device $A_2$, the thickness (d) of each well layer is a main factor which contributes to emitting a laser beam having a multimode spectrum. Specifically, making the thickness (d) of each well layer large is useful for emission of a laser beam having a multimode spectrum.

In the laser device $A_2$, a current injected from the p-type electrode 12B can be controlled by adjusting the width of the ridge waveguide.

Figure 6:
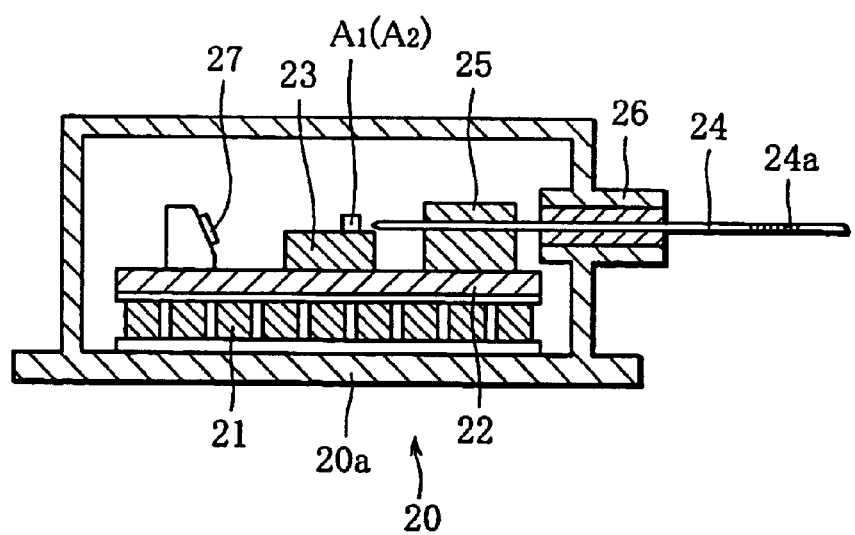
FIG. 6 is a cross-sectional view of an example of a laser module according to the invention.

Using the above-described laser device $A_1$ or $A_2$, a laser module according to the invention is fabricated. FIG. 6 shows an example of a fabricated laser module.

In the laser module, a Peltier module 21 for cooling a laser device $A_1(A_2)$ is arranged on a bottom plate 20a of a package 20. On the Peltier module 21 is arranged a base member 22 of, for example, covar.

On the base member 22, a laser device $A_1(A_2)$ is arranged with a chip carrier 23 between, and an optical fiber 24 including an FBG 24a is optically coupled to the laser device $A_1(A_2)$ with their optical axes aligned.

The optical fiber 24 is fixed over the base member 22 by means of a fiber fixing member 25. The emission end side of the optical fiber is drawn out of the package 20 through a sleeve 26 which is air-tightly fitted to a cylindrical hole of the package.

Behind the rear side of the laser device $A_1(A_2)$ is arranged a photodiode 27 to monitor the optical power of the laser module.

In order to increase the efficiency of optical coupling of the laser device and the optical fiber, it is desirable that the optical fiber is an optical fiber having a lens-shaped end. However, even if the optical fiber does not have a lens-shape end, the efficiency of optical coupling of the laser device and the optical fiber can be increased by arranging a lens between them.

If a wedge-shaped optical fiber is used as the optical fiber, the fabricated optical module shows high optical-coupling efficiency, and the number of parts of the optical module decreases. Thus, total production cost decreases.

In this laser module, since the laser device $A_1(A_2)$ as a light source is designed as described above, a laser beam which is emitted from the laser device $A_1(A_2)$ receiving return light from the FBG 24a has stabilized emitting wavelength and a multimode spectrum, so that the optical power of the laser beam does not vary time-wise.

In the laser module, the laser beam thus emitted propagates in the optical fiber 24. Thus, the optical power of the laser beam emitted from the laser module is stabilized to a high degree.

Embodiments

Embodiments 1 to 3, Comparative Example (1) Structure of Laser Devices

Laser devices $A_1$ each including a DCH and having, as a whole, a layer structure shown in FIG. 2 were fabricated. The specifications of each layer are as shown in table 1. The cavity length (L) of the laser devices was 2100 µm. In each laser device, the reflectance of the front facet and the reflectance of the rear facet were arranged to be 2% and 96%, respectively. The stripe width of the current blocking layer 8 of each laser device was arranged to be 3.2 μm.

power is 0.5% or lower. Thus, the stability of the optical power relative to the injected current value is good.

TABLE 1

| Laser-device layer structure | | | Embodiment 1 | Embodiment 2 | Embodiment 3 | Comparative example |
|---|---|---|---|---|---|---|
| | Substrate 1 | Material | n-GaAs | n-GaAs | n-GaAs | n-GaAs |
| | | Thickness (nm) | $1 \times 10^5$ | $1 \times 10^5$ | $1 \times 10^5$ | $1 \times 10^5$ |
| | Lower cladding layer 2A | Material | n-AlGaAs | n-AlGaAs | n-AlGaAs | n-AlGaAs |
| | | Thickness (nm) | 2355 | 2200 | 2750 | 900 |
| Layer structure D | Lower optical confinement layer 7A | Material | n-GaAs | n-GaAs | n-GaAs | n-GaAs |
| | | Thickness (nm) | 520 | 470 | 550 | 330 |
| | Lower arrier blocking layer 6A | Material | n-AlGaAs | n-AlGaAs | n-AlGaAs | n-AlGaAs |
| | | Thickness (nm) | About 10~100 | About 10~100 | About 10~100 | About 10~100 |
| | Active layer 5 | Side barrier layer $5B_1$ | Material | i-GaAs | i-GaAs | i-GaAs | i-GaAs |
| | | | Thickness (nm) | 55 | 55 | 50 | 55 |
| | | Well layer $5A_1$ | Material | i-InGaAs | i-InGaAs | i-InGaAs | i-InGaAs |
| | | | Thickness (nm) | 8.5 | 10 | 12 | 10 |
| | | Barrier layer $5B_0$ | Material | i-GaAs | i-GaAs | i-GaAs | i-GaAs |
| | | | Thickness (nm) | 6 | 6 | 6 | 6 |
| | | Well layer $5A_2$ | Material | i-InGaAs | i-InGaAs | i-InGaAs | i-InGaAs |
| | | | Thickness (nm) | 8.5 | 10 | 12 | 10 |
| | | Side barrier layer $5B_2$ | Material | i-GaAs | i-GaAs | i-GaAs | i-GaAs |
| | | | Thickness (nm) | 55 | 55 | 50 | 55 |
| | Upper carrier blocking layer 6B | Material | p-AlGaAs | p-AlGaAs | p-AlGaAs | p-AlGaAs |
| | | Thickness (nm) | About 10~100 | About 10~100 | About 10~100 | About 10~100 |
| | Upper optical confinement layer 7B | Material | p-GaAs | p-GaAs | p-GaAs | p-GaAs |
| | | Thickness (nm)(*) | 520 | 470 | 550 | 40 |
| | Current blocking layer 8 | Material | n-AlGaAs | n-AlGaAs | n-AlGaAs | n-AlGaAs |
| | | Thickness (nm) | 10~300 | 10~300 | 10~300 | 10~300 |
| | Upper cladding layer 2B | Material | p-AlGaAs | p-AlGaAs | p-AlGaAs | p-AlGaAs |
| | | Thickness (nm) | 780 | 800 | 820 | 900 |
| | Contact Layer 3 | Material | p-GaAs | p-GaAs | p-GaAs | p-GaAs |
| | | Thickness (nm) | $1.7 \times 10^3$ | $1.7 \times 10^3$ | $1.7 \times 10^3$ | $1.7 \times 10^3$ |

(*)The overall thickness including the current blocking layer in FIG. 2

Thus, Γ value and Γ/d value in each of embodiments 1 to 3 and a comparative example of a laser device are as shown in table 2.

TABLE 2

| | Γ | Γ/d × 10⁻³ (nm⁻¹) |
|---|---|---|
| Embodiment 1 | 0.00597 | 0.702 |
| Embodiment 2 | 0.00767 | 0.767 |
| Embodiment 3 | 0.00807 | 0.673 |
| Comparative Example | 0.02873 | 1.429 |

(2) Characteristics of Laser Devices

Laser modules as shown in FIG. 6 were constructed using the above laser devices.

The FBG optically coupled to each laser device was one designed to have a reflectance of 4%, a reflection bandwidth of 0.5 nm and a wavelength selection characteristic of 975 nm in central wavelength.

1. In the laser module incorporating embodiment 2 of a laser device, the current-optical power characteristic of the laser device was measured. The result is shown in FIG. 7.

Figure 7:
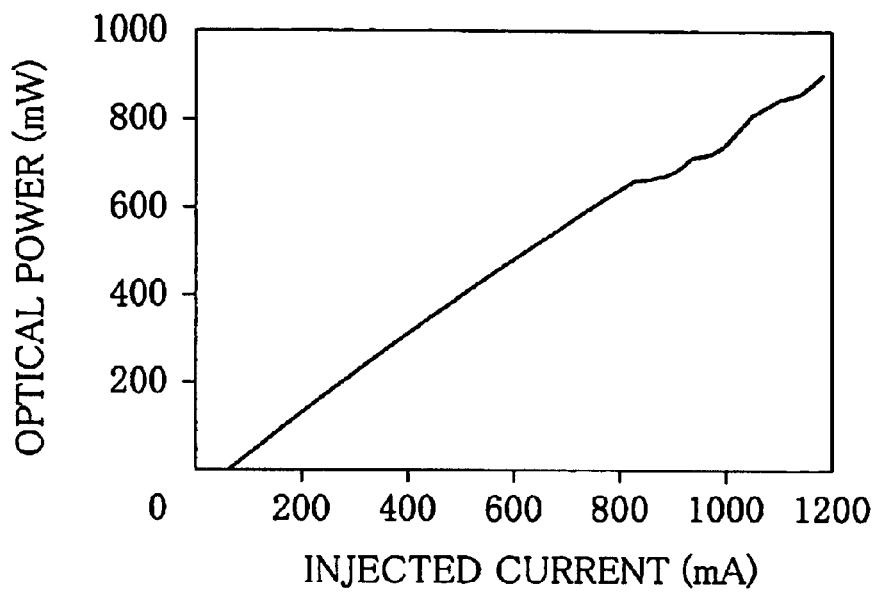
FIG. 7 is a graph showing the current-optical power characteristic of embodiment 2 of a laser device.

As clear from FIG. 7, the laser device emits a laser beam of high optical power in a very stable state, with an injected current up to 800 mA.

2. Next, the current injected to the laser device was increased in increments of 5 mA, the optical power (Pf) from the laser module and the monitor optical intensity (Im) were measured each time, and the rate of change of each (%) was calculated. The result is shown in FIG. 8.

Figure 8:
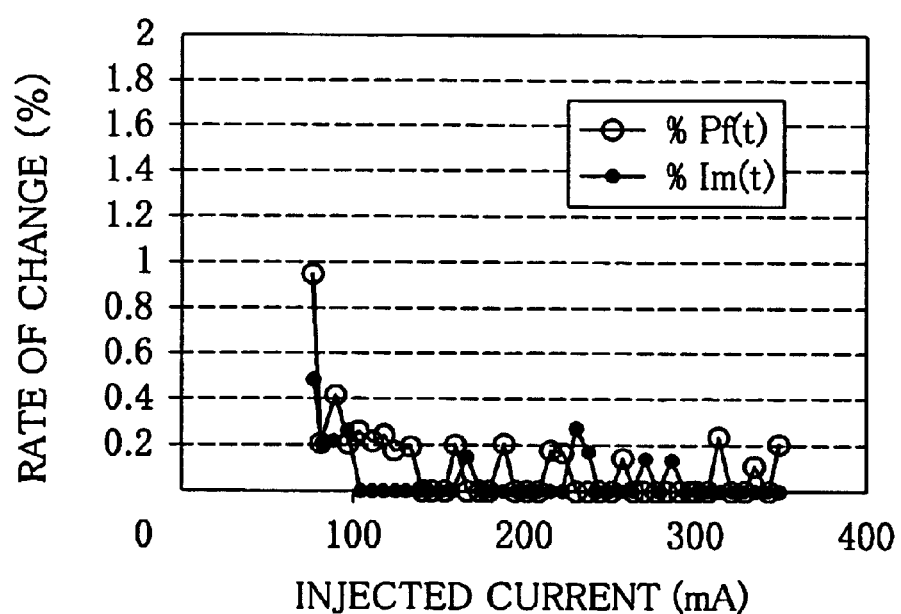
FIG. 8 is a graph showing the rate of change of Pf and the rate of change of Im in a laser module incorporating embodiment 2 of a laser device.

As clear from FIG. 8, in this laser device, even when the injected current changes, the rate of change of the optical 3. The current injected to the laser device was changed, and regarding each value of the injected current, the spectrum of an emitted laser beam was measured at the lapse of 5 seconds after the laser device started operating. The result is shown in FIG. 9.

Figure 9:
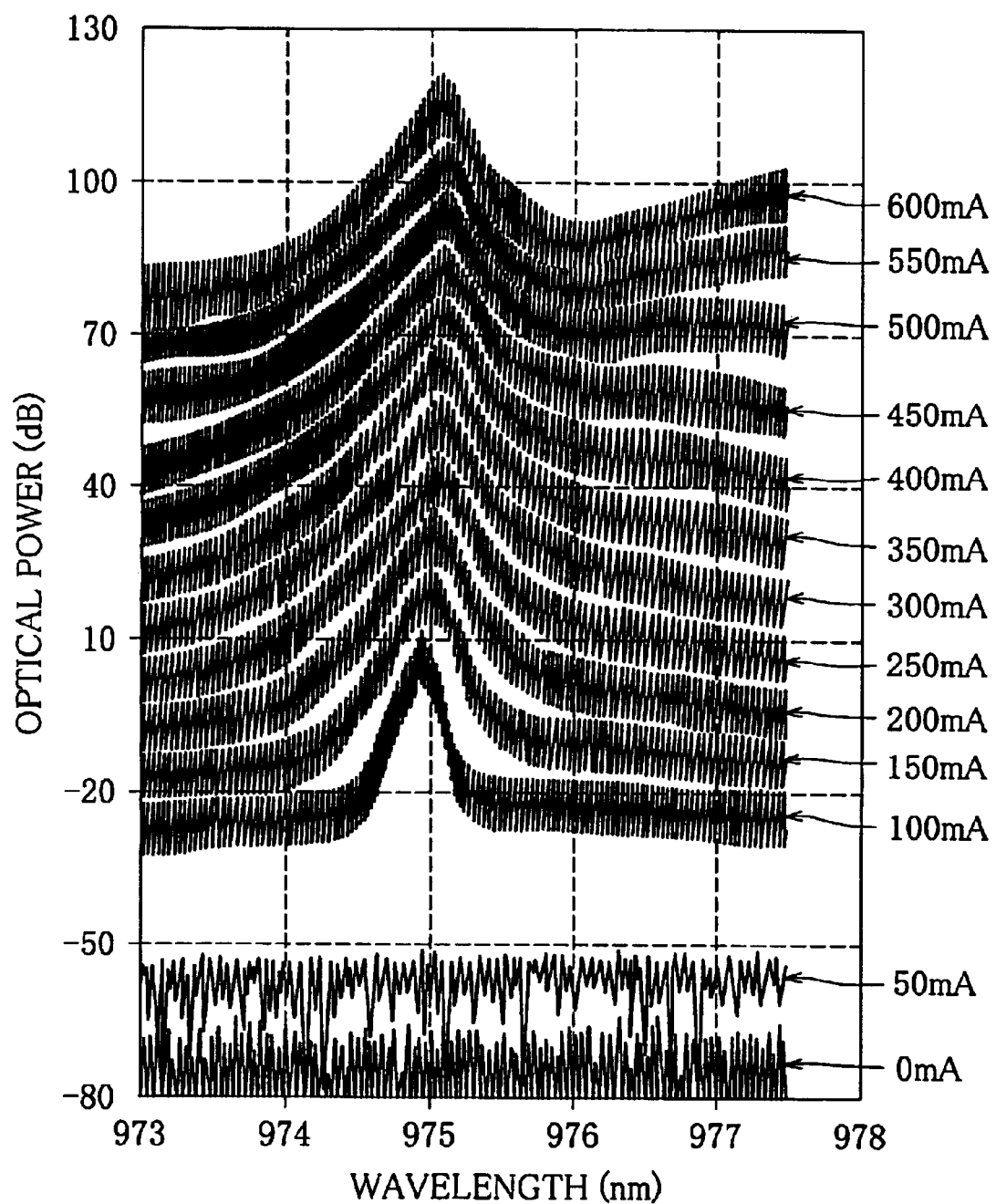
FIG. 9 shows emitting spectra at different values of an injected current.

As clear from FIG. 9, the laser device occillates in multiple modes with all values of the injected current. In FIG. 9, from the spectrum obtained with each value of the injected current, the spectrum width (nm) at a level 10 dB lower than the peak value of the optical power was read, and spectrum widths thus read were plotted against injected current values. The result is shown in FIG. 10.

Also regarding the comparative example of a laser device, the spectrum was measured in the same way as above, and the spectrum width at a level 10 dB lower than the peak value of the optical power was read in the same way. The result is also shown in FIG. 10.

Figure 10:
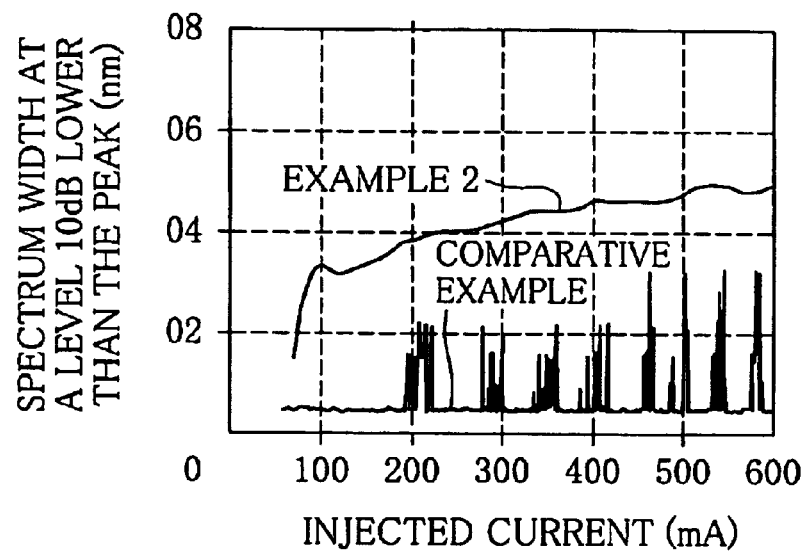
FIG. 10 is a graph showing relation between injected current and spectrum width, which is obtained from the emitting spectra in FIG. 9.

As clear from FIG. 10, in embodiment 2 of a laser device, even when the injected current changes, the spectrum width varies little, and multimode emission is maintained. In contrast, in the comparative example of a laser device, the spectrum width varies to a large degree, and single-mode emission appears frequently.

The same test was carried out on embodiments 1 and 3 of a laser device, and almost the same result was obtained.

Further, laser devices were fabricated changing the stripe width of the current blocking layer 8 in the layer structure of embodiment 2. The current-optical power characteristic of those laser devices was measured and the kink power ($P_k$:mW) was checked.

Figure 11:
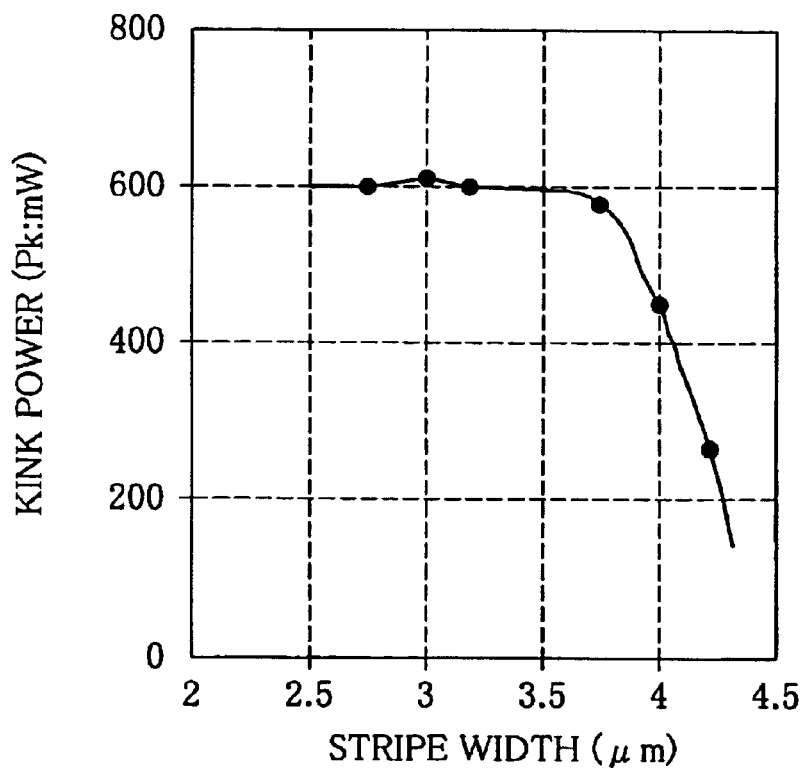
FIG. 11 is a graph showing relation between stripe width of a current blocking layer and kink power.

The result is shown in FIG. 11, as relation between the stripe width and the kink power.

Regarding embodiments 1 and 3 of a laser device, almost the same result as that shown in FIG. 11 was obtained.

Embodiment 4

(1) Structure of Laser Devices

Laser devices $A_2$ each including a SCH and having, as a whole, a layer structure shown in FIG. 4 were fabricated. The specifications of each layer are as shown in table 3. As laser devices $A_2$, one whose cavity length (L) was 1500 μm and one whose cavity length (L) was 2000 μm were both fabricated. In each laser device, the reflectance of the front facet and the reflectance of the rear facet were arranged to be 1% and 92%, respectively.

TABLE 3

| | | | Embodiment 4 |
|---|---|---|---|
| Substrate 10 | | Material | n-GaAs |
| | | Thickness (nm) | 1 × 10⁵ |
| Lower cladding layer 11A | | Material | n-AlGaAs |
| | | Thickness (nm) | 4 × 10³ |
| Layer structure E | Lower optical confinement layer 15A | Material | n-AlGaAs |
| | | Thickness (nm) | 5 |
| Active layer 14 | Barrier layer 14B₁ | Material | i-GaAsP |
| | | Thickness (nm) | 5 |
| | Well layer 14A₁ | Material | i-InGaAs |
| | | Thickness (nm) | 9 |
| | Barrier layer 14B₂ | Material | i-GaAsP |
| | | Thickness (nm) | 5 |
| | Well layer 14A₀ | Material | i-InGaAs |
| | | Thickness (nm) | 9 |
| | Barrier layer 14B₃ | Material | i-GaAsP |
| | | Thickness (nm) | 5 |
| | Well layer 14A₂ | Material | i-InGaAs |
| | | Thickness (nm) | 9 |
| | Barrier layer 14B₄ | Material | i-GaAsP |
| | | Thickness (nm) | 5 |
| Upper optical confinement layer 15B | | Material | p-AlGaAs |
| | | Thickness (nm) | 5 |
| Upper cladding layer 11B | | Material | p-GaAs |
| | | Thickness (nm) | 2 × 10³ |
| Contact layer 16 | | Material | n-GaAs |
| | | Thickness (nm) | 0.5 × 10³ |

In each laser device, the optical confinement factor (Γ) of the well layer is 0.011, thus, Γ/d value is $1.2 \times 10^{-3}$ nm$^{-1}$.

It was confirmed that these laser devices emitted in multiple modes like embodiments 1 to 3.

Embodiments 5 to 15

Laser devices shown in Tables 4 and 5 were fabricated, changing Γ/d value by changing the well layer thickness in the layer structure of embodiment 2 having the DCH shown in table 1, and also changing the cavity length (L).

Using these laser devices, laser modules were constructed in the same way as described with respect to embodiments 1 to 3.

TABLE 4

| Laser-device layer structure | | | Embodiment 5 | Embodiment 6 | Embodiment 7 | Embodiment 8 | Embodiment 9 | Embodiment 10 |
|---|---|---|---|---|---|---|---|---|
| | Substrate 1 | Material | n-GaAs | n-GaAs | n-GaAs | n-GaAs | n-GaAs | n-GaAs |
| | | Thickness (nm) | 1 × 10⁵ | 1 × 10⁵ | 1 × 10⁵ | 1 × 10⁵ | 1 × 10⁵ | 1 × 10⁵ |
| | Lower cladding layer 2A | Material | n-AlGaAs | n-AlGaAs | n-AlGaAs | n-AlGaAs | n-AlGaAs | n-AlGaAs |
| | | Thickness (nm) | 2090 | 2130 | 2340 | 2240 | 2380 | 2340 |
| Layer structure D | Lower optical confinement layer 7A | Material | n-GaAs | n-GaAs | n-GaAs | n-GaAs | n-GaAs | n-GaAs |
| | | Thickness (nm) | 630 | 640 | 340 | 465 | 400 | 340 |
| | Lower carrier blocking layer 6A | Material | n-AlGaAs | n-AlGaAs | n-AlGaAs | n-AlGaAs | n-AlGaAs | n-AlGaAs |
| | | Thickness (nm) | About 10~100 | About 10~100 | About 10~100 | About 10~100 | About 10~100 | About 10~100 |
| Active Layer 5 | Side barrier layer 5B₁ | Material | i-GaAs | i-GaAs | i-GaAs | i-GaAs | i-GaAs | i-AlGaAs |
| | | Thickness (nm) | 55 | 45 | 50 | 45 | 50 | 50 |
| | Well layer 5A₁ | Material | i-InGaAs | i-InGaAs | i-InGaAs | i-InGaAs | i-InGaAs | i-InGaAs |
| | | Thickness (nm) | 10 | 12 | 12 | 12 | 12 | 12 |
| | Barrier layer 5B₀ | Material | i-GaAs | i-GaAs | i-GaAs | i-GaAs | i-GaAs | i-AlGaAs |
| | | Thickness (nm) | 6 | 6 | 6 | 6 | 6 | 6 |
| | Well layer 5A₂ | Material | i-InGaAs | i-InGaAs | i-InGaAs | i-InGaAs | i-InGaAs | i-InGaAs |
| | | Thickness (nm) | 10 | 12 | 12 | 12 | 12 | 12 |
| | Side barrier layer 5B₂ | Material | i-GaAs | i-GaAs | i-GaAs | i-GaAs | i-GaAs | i-AlGaAs |
| | | Thickness (nm) | 55 | 45 | 50 | 45 | 50 | 50 |
| | Upper carrier blocking layer 6B | Material | p-AlGaAs | p-AlGaAs | p-AlGaAs | p-AlGaAs | p-AlGaAs | p-AlGaAs |
| | | Thickness (nm) | About 10~100 | About 10~100 | About 10~100 | About 10~100 | About 10~100 | About 10~100 |
| | Upper optical confinement layer 7B | Material | p-GaAs | p-GaAs | p-GaAs | p-GaAs | p-GaAs | p-GaAs |
| | | Thickness (nm)(*) | 630 | 640 | 340 | 465 | 400 | 340 |
| | Current blocking layer 8 | Material | n-AlGaAs | n-AlGaAs | n-AlGaAs | n-AlGaAs | n-AlGaAs | n-AlGaAs |
| | | Thickness (nm) | 10~300 | 10~300 | 10~300 | 10~300 | 10~300 | 10~300 |
| | Upper cladding layer 2B | Material | p-AlGaAs | p-AlGaAs | p-AlGaAs | p-AlGaAs | p-AlGaAs | p-AlGaAs |
| | | Thickness (nm) | 800 | 790 | 1660 | 840 | 1470 | 1660 |
| | Contact layer 3 | Material | p-GaAs | p-GaAs | p-GaAs | p-GaAs | p-GaAs | p-GaAs |
| | | Thickness (nm) | 1.7 × 10³ | 1.7 × 10³ | 1.7 × 10³ | 1.7 × 10³ | 1.7 × 10³ | 1.7 × 10³ |
| | Γ/d (nm⁻¹) | | 0.595238 | 0.588235 | 0.877193 | 0.961538 | 0.869565 | 0.877193 |
| | ΔEc (meV) | | 110 | 106 | 106 | 106 | 106 | 190 |

TABLE 5

| Laser-device layer structure | | | Embodiment 11 | Embodiment 12 | Embodiment 13 | Embodiment 14 | Embodiment 15 |
|---|---|---|---|---|---|---|---|
| Substrate 1 | | Material | n-GaAs | n-GaAs | n-GaAs | n-GaAs | n-GaAs |
| | | Thickness (nm) | $1 \times 10^5$ | $1 \times 10^5$ | $1 \times 10^5$ | $1 \times 10^5$ | $1 \times 10^5$ |
| Lower cladding layer 2A | | Material | n-AlGaAs | n-AlGaAs | n-AlGaAs | n-AlGaAs | n-AlGaAs |
| | | Thickness (nm) | 2250 | 2590 | 2590 | 2230 | 2590 |
| Layer structure D | Lower optical confinement layer 7A | Material | n-GaAs | n-GaAs | n-GaAs | n-GaAs | n-GaAs |
| | | Thickness (nm) | 475 | 475 | 480 | 560 | 475 |
| | Lower carrier blocking layer 6A | Material | n-AlGaAs | n-AlGaAs | n-AlGaAs | n-AlGaAs | n-AlGaAs |
| | | Thickness (nm) | About 10~100 | About 10~100 | About 10~100 | About 10~100 | About 10~100 |
| | Active layer 5 | Side barrier layer $5B_1$ Material | i-GaAs | i-GaAs | i-AlGaAs | i-GaAs | i-GaAs |
| | | Thickness (nm) | 50 | 50 | 50 | 50 | 50 |
| | | Well layer $5A_1$ Material | i-InGaAs | i-InGaAs | i-InGaAs | i-InGaAs | i-InGaAs |
| | | Thickness (nm) | 12 | 12 | 7 | 7 | 7 |
| | | Barrier layer $5B_0$ Material | i-GaAs | i-GaAs | i-GaAs | i-GaAs | i-GaAs |
| | | Thickness (nm) | 6 | 6 | 6 | 6 | 6 |
| | | Well layer $5A_2$ Material | i-InGaAs | i-InGaAs | i-InGaAs | i-InGaAs | i-InGaAs |
| | | Thickness (nm) | 12 | 12 | 7 | 7 | 7 |
| | | Side barrier layer $5B_2$ Material | i-GaAs | i-GaAs | i-AlGaAs | i-GaAs | i-GaAs |
| | | Thickness (nm) | 50 | 50 | 50 | 50 | 50 |
| | Upper carrier blocking layer 6B | Material | p-AlGaAs | p-AlGaAs | p-AlGaAs | p-AlGaAs | p-AlGaAs |
| | | Thickness (nm) | About 10~100 | About 10~100 | About 10~100 | About 10~100 | About 10~100 |
| | Upper optical confinement layer 7B | Material | p-GaAs | p-GaAs | p-GaAs | p-GaAs | p-GaAs |
| | | Thickness (nm)(*) | 475 | 475 | 480 | 560 | 475 |
| Current blocking layer 8 | | Material | n-AlGaAs | n-AlGaAs | n-AlGaAs | n-AlGaAs | n-AlGaAs |
| | | Thickness (nm) | 10~300 | 10~300 | 10~300 | 10~300 | 10~300 |
| Upper cladding layer 2B | | Material | p-AlGaAs | p-AlGaAs | p-AlGaAs | p-AlGaAs | p-AlGaAs |
| | | Thickness (nm) | 840 | 830 | 830 | 830 | 830 |
| Contact layer 3 | | Material | p-GaAs | p-GaAs | p-GaAs | p-GaAs | p-GaAs |
| | | Thickness (nm) | $1.7 \times 10^3$ | $1.7 \times 10^3$ | $1.7 \times 10^3$ | $1.7 \times 10^3$ | $1.7 \times 10^3$ |
| $\Gamma/d$ (nm$^{-1}$) | | | 0.917431 | 0.925926 | 0.588235 | 0.657895 | 0.934579 |
| $\Delta Ec$ (meV) | | | 106 | 106 | 202 | 118 | 118 |

Each laser device was made to occillate, the spectrum of an emitting laser beam was measured, and whether it was a multimode spectrum or not was observed. Embodiments 5 to 15 of a laser device all showed a spectrum as shown in FIG. 9. Embodiments 5 to 15 were plotted on the cavity length (L) versus $\Gamma/d$ value ($\times 10^{-3}$nm$^{-1}$) coordinate system. The result is shown in FIG. 12.

Figure 12:
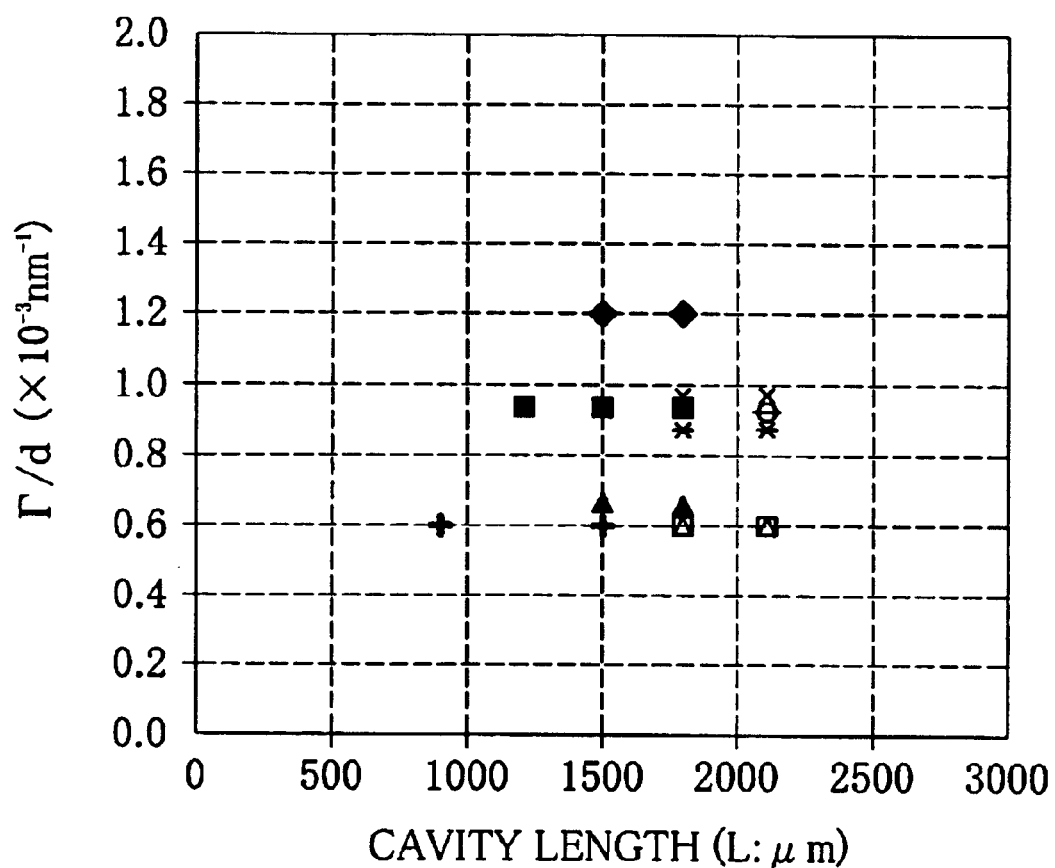
FIG. 12 is a graph where embodiments 5 to 15 of a semiconductor laser device, which emitted in multiple modes, are plotted on the cavity length (L) versus $\Gamma/d$ value coordinate system.

In FIG. 12, "□" represents embodiment 5, "+" embodiments 6 and 13, "△" embodiments 7 and 10, "×" embodiment 8, "*" embodiment 9, "−" embodiment 11, "○" embodiment 12 "▲" embodiment 14, and "■" embodiment 15.

For reference, embodiment 4 of a laser device $A_2$ is also plotted in FIG. 12 using "◆".

The embodiments of a laser device which were designed to have $\Gamma/d$ value of $1.3 \times 10^{-3}$nm$^{-1}$ or smaller as seen from FIG. 12 all emitted in multile modes as shown in FIG. 9, irrespective of the cavity length (L), and their optical power was stabilized. Hence, it is clear that in order to have a multimode emitting spectrum and thereby stabilize the optical power, it is effective to arrange that $\Gamma/d$ value is $1.3 \times 10^{-3}$nm$^{-1}$ or smaller.

Industrial Applicability

As clear from the above, in the laser device according to the invention, the emitting wavelength is stabilized by the action of return light, and the relation between the optical confinement factor ($\Gamma$) and the thickness (d) of each well layer is so arranged that coherence collapse with return light occurs. Thus, the emitted laser beam has a multimode spectrum, and thus, the optical power thereof is stabilized.

What is claimed is:

1. A Fabry-Perot type semiconductor laser device having a layer structure including an active layer of a quantum well structure, and emitting a laser beam having wavelength stabilized by an action of return light and having a multimode spectrum, wherein each well layer satisfies relation:

$\Gamma/d \leq 1.3 \times 10^{-3}$nm$^{-1}$ where $\Gamma$ and d(nm) are an optical confinement factor and a thickness of a well layer, respectively.

2. The semiconductor laser device according to claim 1, wherein said return light is return light from an optical feedback mechanism.

3. The semiconductor laser device according to claim 2, wherein said optical feedback mechanism is a Fiber Bragg Grating.

4. The semiconductor laser device according to claim 1, wherein the thickness of each well layer in said active layer is 8.5 nm or larger.

5. The semiconductor laser device according to claim 1, wherein difference between energy level of a conduction band of each barrier layer in said active layer and energy level of a conduction band of each well layer in said active layer is 170 meV or smaller.

6. The semiconductor laser device according to claim 4, wherein a major part of injected carriers are optimized within a profile region of an emitted laser beam.

7. The semiconductor laser device according to claim 5, wherein a major part of injected carriers are optimized within a profile region of an emitted laser beam.

8. The semiconductor laser device according to claim 6, wherein said optimization is done by selecting a stripe width of a current blocking layer.

9. The semiconductor laser device according to claim 7, wherein said optimization is done by selecting a stripe width of a current blocking layer.

10. The semiconductor laser device according to claim 6, wherein optical confinement layers are formed in the state of interposing said active layer, and carrier blocking layers are each provided between said active layer and one of said optical confinement layers, said carrier blocking layers having bandgap energy larger than bandgap energy of said active layer and bandgap energy of said optical confinement layers.

11. The semiconductor laser device according to claim 7, wherein optical confinement layers are formed in the state of interposing said active layer, and carrier blocking layers are each provided between said active layer and one of said optical confinement layers, said carrier blocking layers having bandgap energy larger than bandgap energy of said active layer and bandgap energy of said optical confinement layers.

12. A laser module wherein an optical fiber is optically coupled to an emission end face of a semiconductor laser device according to claim 1.

13. A laser module wherein an optical fiber is optically coupled to an emission end face of a semiconductor laser device according to claim 2.

14. A laser module wherein an optical fiber is optically coupled to an emission end face of a semiconductor laser device according to claim 3.

15. A laser module wherein an optical fiber is optically coupled to an emission end face of a semiconductor laser device according to claim 4.

16. A laser module wherein an optical fiber is optically coupled to an emission end face of a semiconductor laser device according to claim 5.

17. A laser module wherein an optical fiber is optically coupled to an emission end face of a semiconductor laser device according to claim 6.

18. A laser module wherein an optical fiber is optically coupled to an emission end face of a semiconductor laser device according to claim 7.

19. A laser module wherein an optical fiber is optically coupled to an emission end face of a semiconductor laser device according to claim 8.

20. A laser module wherein an optical fiber is optically coupled to an emission end face of a semiconductor laser device according to claim 9.

21. A laser module wherein an optical fiber is optically coupled to an emission end face of a semiconductor laser device according to claim 10.

22. A laser module wherein an optical fiber is optically coupled to an emission end face of a semiconductor laser device according to claim 11.

* * * * *